United States Patent [19]
Sheets et al.

[11] Patent Number: 5,559,629
[45] Date of Patent: Sep. 24, 1996

[54] UNIT MAGNIFICATION PROJECTION SYSTEM AND METHOD

[75] Inventors: Ronald E. Sheets, Santa Ana; Yanrong Yuan, Irvine, both of Calif.

[73] Assignee: Tamarack Scientific Co., Inc., Anaheim, Calif.

[21] Appl. No.: 347,818

[22] Filed: Nov. 30, 1994

Related U.S. Application Data

[63] Continuation-in-part of Ser. No. 302,584, Sep. 8, 1994, abandoned, which is a continuation-in-part of Ser. No. 293,398, Aug. 19, 1994, abandoned.

[51] Int. Cl.$^6$ .................................................. G02B 17/00
[52] U.S. Cl. .................. 359/364; 359/650; 359/720; 359/727; 359/737; 359/900; 355/53
[58] Field of Search .......................... 359/362, 366, 359/720, 726, 727, 360, 364, 649, 650, 651, 737, 900; 355/53

[56] References Cited

U.S. PATENT DOCUMENTS

| | | | |
|---|---|---|---|
| 4,068,947 | 1/1978 | Buckley et al. | 355/72 |
| 4,103,989 | 8/1978 | Rosin | 359/730 |
| 4,171,870 | 10/1979 | Bruning et al. | 359/487 |
| 4,171,871 | 10/1979 | Dill et al. | 359/730 |
| 4,288,148 | 8/1981 | Offner et al. | 359/744 |
| 4,293,186 | 10/1981 | Offner | 359/366 |
| 4,302,079 | 11/1981 | White | 359/352 |
| 4,425,037 | 1/1984 | Hershel et al. | 355/43 |
| 4,585,337 | 4/1986 | Phillips | 355/45 |
| 4,693,569 | 9/1987 | Offner | 359/366 |
| 4,701,608 | 10/1987 | Morita et al. | 250/205 |
| 4,734,835 | 3/1988 | Vines et al. | 362/264 |
| 4,747,678 | 3/1988 | Shafer et al. | 359/366 |
| 4,778,233 | 10/1988 | Christenson et al. | 359/214 |
| 4,964,705 | 10/1990 | Markle | 359/727 |
| 4,991,962 | 2/1991 | Jain | 356/349 |
| 5,003,345 | 3/1991 | Markle | 355/53 |
| 5,040,882 | 8/1991 | Markle | 359/727 |
| 5,089,913 | 2/1992 | Singh et al. | 359/727 |
| 5,161,062 | 11/1992 | Shafer et al. | 359/785 |
| 5,164,794 | 11/1992 | Markle | 356/394 |
| 5,168,306 | 12/1992 | Morimoto et al. | 355/53 |
| 5,212,593 | 5/1993 | Williamson et al. | 359/487 |
| 5,227,839 | 7/1993 | Allen | 355/53 |
| 5,298,939 | 3/1994 | Swanson et al. | 355/53 |
| 5,323,263 | 6/1994 | Schoenmakers | 359/366 |
| 5,402,205 | 3/1995 | Markle et al. | 355/53 |

OTHER PUBLICATIONS

J. Dyson; "Unit Magnification Optical System without Seidel Aberrations"; Journal of the Optical Society of America, vol. 49, No. 7, Jul., 1959; pp. 713–716.

Douglas S. Goodman of IBM, T. J. Watson Research Center, Yorktown, New York; "Scanning Excimer Ablation System"; Optical Society of America Annual Meeting in San Jose, California, Nov. 6, 1991.

*Primary Examiner*—Paul M. Dzierzynski
*Assistant Examiner*—John Juba, Jr.
*Attorney, Agent, or Firm*—Richard L. Gausewitz

[57] ABSTRACT

A Dyson lens system includes a radiation source, a concave mirror, and a plano-convex lens. There is also incorporated in the system an additional lens that is spaced from the plano-convex lens a large part of the distance from the plano-convex lens to the mirror. A roof prism and a turning prism are provided to conduct radiation from the radiation source to the plano-convex lens and also from the plano-convex lens to an image plane. An image adjustor or compensator is provided between the prisms and either the image plane or an object plane—the latter being disposed between the radiation source and the prisms. An adjustment mechanism is provided to effect highly accurate adjustment of the location of the image, the adjustment mechanism including physical shifting to a slight degree of a portion of one or both prisms.

59 Claims, 4 Drawing Sheets

UNIT MAGNIFICATION PROJECTION SYSTEM AND METHOD

CROSS REFERENCE TO RELATED APPLICATIONS

This application is a continuation-in-part of patent application Ser. No. 08/302,584, filed Sep. 8, 1994 and now abandoned, for a Unit Magnification Projection System and Method, inventors Ronald E. Sheets and Yanrong Yuan, which is a continuation-in-part of patent application Ser. No. 08/293,398, filed Aug. 19, 1994 and now abandoned, for Unit Magnification Projection System and Method, inventor Yanrong Yuan.

BACKGROUND OF THE INVENTION

Step-and-repeat projection microlithographic systems used in the microelectronics industry achieve important advantages, notably including extremely high quality. However, such systems also have major disadvantages. These include very low throughputs, and very high capital costs for the systems.

It would be a distinct benefit to the industry if a projection microlithographic system could be created that is characterized by high throughput and relatively low capital cost, yet still achieves a large part of the quality of step-and-repeat systems.

One significant reason why step-and-repeat systems are commonly used is that the substrates can shrink as the result of process steps. Shrinkage can be caused by such factors as the firing of the substrates, or the putting down of thin layers of materials on the substrates. Such layers may create stresses which pull on the substrates in such manner as to shrink them. Although both types of shrinkage are dimensionally small, they can create significant errors in the microelectronics components being fabricated. Step-and-repeat systems compensate for the shrinkage, and so reduce or eliminate these errors.

Prior art related to projection microlithography has often involved Dyson projection or imaging systems. These 1-to-1 systems are well known to create important advantages. They have not, however, been previously so constructed or used as to achieve to a high degree (if at all), and/or in a high quality way, the following:

(1) a large field size, such as 60 mm by 60 mm, with high quality, and with (for example) a 10-inch diameter primary mirror, so that throughput is massively increased;

(2) large air gaps between the prisms (or mirrors) of the Dyson system, and the object and image planes thereof, in combination with a magnification adjustment element that is disposed in one of these air gaps and employed to compensate for such factors as the above-indicated shrinkage of the substrates;

(3) an image plane that is parallel to the object plane, and an image that has the same orientation as the object, so that continuous scanning can be practically and effectively performed;

(4) correction for the three near-UV spectral lines of mercury (365 nm, 405 nm, and 436 nm wavelengths) for the whole field, thus permitting much transfer of power from a mercury light source to the substrate, and correction for the alignment wavelength (577 nm) at the central, reduced, field;

(5) a high numerical aperture (NA) for a 1-to-1 system, with consequent good resolution, and a large field size under these conditions;

(6) magnification compensation or adjustment with very low distortion at all settings, and magnification compensation or adjustment with very little change in modulation transfer function at all settings;

(7) Dyson system elements that are selected, constructed and located to perform functions including (a) correction of field aberrations, (b) correction of chromatic aberrations—with consequent good image quality over the large field and even with the large air gaps, and (c) reduction of astigmatism;

(8) An adjustment mechanism for effecting very small adjustments in the positions of the prisms in order to aid in achieving precise registry or superposition of a point or small line in the projected image during one scan of a scanning projection microlithography system, in comparison to the image of the same point or line during the next scan.

SUMMARY OF THE INVENTION

The above-listed important factors, benefits, etc., are achieved by providing a Dyson projection system incorporating an additional lens spaced from the primary mirror and also spaced from the plano-convex lens. This additional lens reduces astigmatism, and cooperates with the other lenses in an apochromatic assembly, to optimize full chromatic correction over the entire area.

Also by causing the plano-convex lens to be closely associated with a concavo-convex lens, and by selecting the glass types employed in the indicated additional lens, in the plano-convex lens, and in the concavo-convex lens so as to result in the highly effective apochromatic assembly.

Also by causing the Dyson system to include a roof prism combined with a right-angle prism in such manner that a high-quality image results, which image has the same orientation as the object and is preferably in a plane parallel to that of the object. The prisms help achieve a high NA and good resolution, and the large-size high-quality field. The field is a desired nesting shape—not just a slit.

Also by providing, in the indicated Dyson system, a primary mirror that is slightly aspherical and cooperates with the above-indicated lens group in correcting the high-order chromatic aberrations for the large field. Such aspherical mirror also aids in achieving the high NA and good resolution.

Also by providing in one of the air gaps a magnification adjustor or compensator that effectively, and without creating substantial disadvantages, changes very slightly the magnification so that it may be just under or just over 1-to-1. The desired degree of magnification change is determined by the amount of shrinkage—or possible enlargement—of the substrate.

Also (stated more specifically) by providing a Dyson system that incorporates, in combination with each other, a plano-convex lens, a concavo-convex lens, a thick meniscus (meniscus shell) lens, a concave aspherical mirror, a roof prism, or right-angle prism, a magnification compensator, large air gaps, and precision adjustment mechanism for the prisms. These are all so constructed and related as to cooperate effective with each other and to fit between parallel object and image planes.

Also by providing a method of achieving a large-size high-quality field, and/or of accurately adjusting magnification.

Also by providing an apparatus and method for achieving very fine and precise adjustments in the position or positions of one or more prisms in order to cause very accurate registry or superposition of projected images during overlapping scans in a scanning projection microlithographic system.

DETAILED DESCRIPTION

Figure 1:
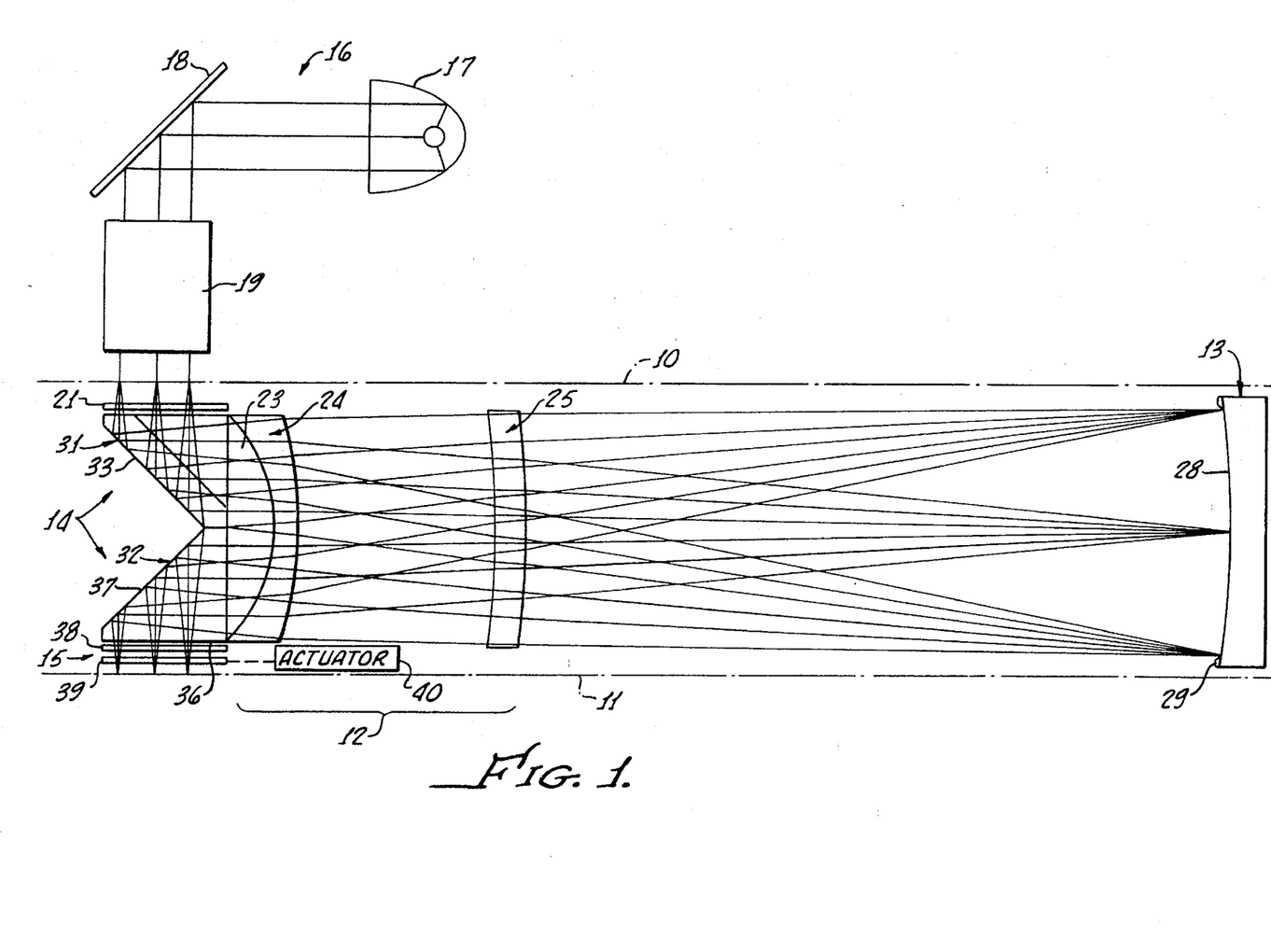
FIG. 1 is a schematic view, including ray traces, of a Dyson system incorporating the invention, such schematic view corresponding to a section taken in a plane that is perpendicular to the object and image planes and contains the apex of the roof prism.
Figure 2:
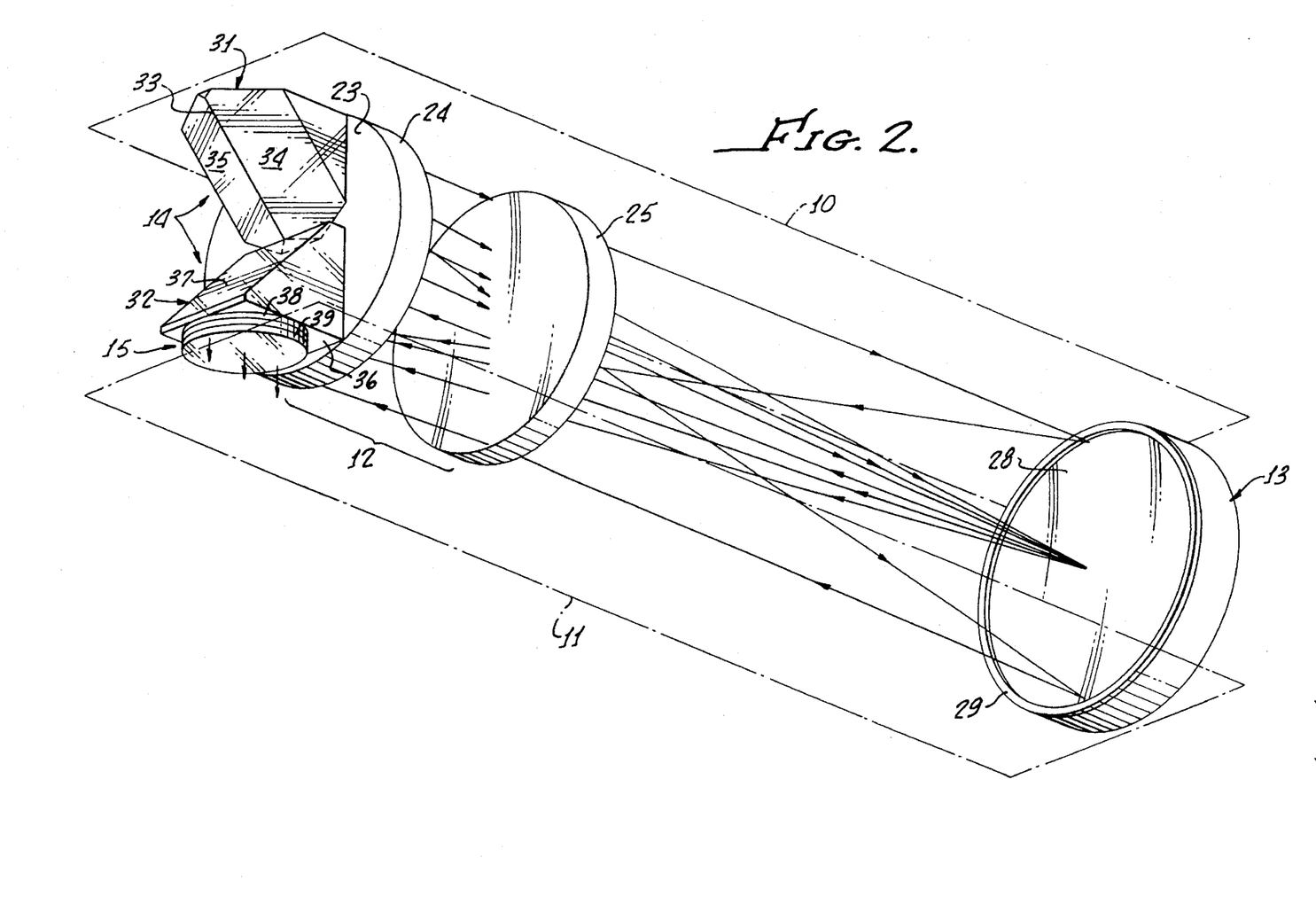
FIG. 2 is an isometric view of the system of FIG. 1, but without a showing of the light source or of the actuator for the magnification adjustor.

Referring to FIGS. 1 and 2, there are indicated an object plane 10 that is parallel to and spaced from an image plane 11, such planes being disposed on opposite sides of the Dyson projection system. Stated otherwise, the Dyson system is between the parallel planes. The object plane 10 is adapted to have mounted therein a reticle or mask or microelectronics pattern (typically on a film and/or glass) that is to be projected onto image plane 11. The image plane 11 is adapted to have mounted therein the product being fabricated or manufactured, typically a substrate coated with a photoresist. Stated more definitely, the product (incomplete) in the image plane may be (for example) a flat-panel display, or a multi-chip module, or a very high resolution printed circuit board, or a large semiconductor wafer. Typically, the semiconductor wafer has a diameter of 6 inches or more, ranging up to 14 inches or more; in the scanning apparatus in which the present lens system is employed the product in the image plane can have any size up to very large ones.

The present Dyson projection system comprises a group or assembly 12 of lenses, a primary mirror 13, a prism combination 14, and a magnification compensator or adjustor 15.

As indicated in FIG. 1, there is disposed—on the side of plane 10 remote from the Dyson system—a radiation source 16. The illustrated source is one that generates uniform UV broad band light. Stated more definitely, it is a mercury short-arc lamp 17 having a wattage of (for example) 1000. Lamp 17 directs light onto a mirror/filter 18 which turns the UV rays toward plane 10 through collimating or beam-forming optics 19. The optics 19 may include, for example, a fly's-eye homogenizing system, or a light-pipe (tunnel) homogenizing system.

Radiation from elements 17–19 is directed through the reticle, etc., and thence through a window 21 and the various elements 14,12,13 and 15 to the image plane 11 and substrate therein.

Apochromatic Assembly 12

The lens group or assembly 12 is apochromatic. It comprises (from left to right in FIG. 1) a plano-convex lens 23, a concavo-convex lens 24 and a thick meniscus (meniscus shell) lens 25, all (like primary mirror 13) mounted along the optical axis of the system.

Lens 23, which is the "last lens" (not including the magnification adjustor 15), has its plane surface facing away from mirror 13. It has its convex surface facing mirror 13 and nested into the concave surface of lens 24. Lenses 23,24 may be cemented together to form a doublet. Lens 24 has it convex surface facing mirror 13. The curvature of such convex surface of lens 24 is less than that of the concave surface of lens 24, and less than that of the convex surface of lens 23.

Meniscus lens 25 has its convex surface facing mirror 13, and its concave surface facing away from mirror 13 and toward last lens 23. The curvatures of the surfaces of meniscus lens 25 are less than those of lens 24.

Lens 25 is spaced a substantial distance from last lens 23 and from lens 24. In a typical system incorporating the present invention, meniscus lens 25 is spaced a large part of the distance (for example, about one-quarter or about one-third of the distance) from last lens 23 to the mirror surface 28 of mirror 13.

Lenses 23,24 and 25 are made of different glass types. By selecting certain glass types for the three lenses, the system is corrected for chromatic aberrations for the three UV spectral lines (365 nm, 405 nm, and 436 nm) of the mercury arc lamp 17 for the whole field, and for the 577 nm wavelength for alignment at the narrow field. Correction for the 365, 405 and 436 spectral lines increases power transfer from lamp 17 to the substrate. With different glass types, the system can be corrected for chromatic aberrations from 350 nm to 450 nm for the whole field. Areas close to the optical axis (reduced field) are corrected from 350 nm to 600 nm.

The lenses 23–25 correct field aberrations as well as chromatic aberrations.

Lens 25 is important in the correction of astigmatism.

Light-transmissive surfaces in the optical system are coated to increase light-transmission therethrough. Reflective surfaces in the optical system are coated to increase reflectivity.

Primary Mirror 13

Primary mirror 13 has a substantially spherical concave surface 28 centered on the optical axis and facing last lens 23. Surface 28 could be spherical but is very preferably slightly aspherical (both of which shapes are included in the words "substantially spherical").

Surface 28 is slightly aspherical, namely slightly ellipsoidal, departing very slightly from a true sphere in order to help correct the high-order chromatic aberrations for the large field. The aspherical surface 28 is so shaped and so related to the lens group 12 containing lenses 23,24 and 25 as to optimize the correction of chromatic aberrations. Lens group 12 and mirror surface 28 cooperate with each other in this and other regards.

There is represented schematically in FIGS. 1 and 2 a large diameter aperture stop 29 which permits a high NA. It is to be understood that the aperture stop 29 may be reduced substantially in diameter in order to reduce the NA while increasing the depth of focus. The NA may thus be changed between (for example) 0.14 and 0.07.

Prism Combination 14

As shown in FIGS. 1 and 2, a roof prism 31 and a right-angle (turning) prism 32 are mounted adjacent each other and adjacent last lens 23. Prisms 31,32 are mounted on the side of lens 23 remote from mirror 13, and are between planes 10 and 11.

The prisms and the lenses are (of course) sufficiently large to receive therein the particular field size and shape being projected from object plane 10 to image plane 11. The presently contemplated field, as viewed in either of planes 10 and 11, is a square each side of which is 60 mm long. Such square is turned so that a diagonal thereof (lying in either plane 10 or 11) is parallel to the plane of the flat (planar) face of last lens 23.

The particular shape and size of field are achieved using the beam-forming optics 19, by providing the appropriate aperture or pupil. Field sizes and shapes other than the indicated square one may be employed, but for a scanning system the field shape should be an appropriate nesting one.

Each prism 31,32 has a planar face that lies in a plane perpendicular to planes 10,11 and also perpendicular to the optical axis of lenses 23–25 and mirror 13. Such faces of the prisms 31,32 are adjacent the planar face of last lens 23.

Roof prism 31 has an apex edge 33, this being a straight edge that extends toward plane 10 at a 45-degree angle to such plane, being also at a 45-degree angle to the planar face of last lens 23. Apex edge 23 lies in a plane that contains the optical axis of lenses 23–25 and mirror 13, and that is perpendicular to planes 10,11.

Roof prism 31 has roof surfaces 34,35 each of which is planar and extends to apex edge 33, and is at a 45-degree angle to the last-mentioned plane. Thus, roof surfaces 34,35 are at a 90-degree angle to each other. The roof prism is symmetrical about the last-mentioned plane.

Right-angle prism 32 has a planar face 36 parallel to and facing object plane 11. It has a face 37 lying at a 45-degree angle to planes 10,11, being also perpendicular to the above-indicated plane that contains apex edge 33 and is perpendicular to planes 10,11. Face 37 is at a 90-degree angle to apex edge 33. Face 37 and apex edge 33 are convergent, relative to each other, in a direction toward the primary mirror.

Prisms 31,32 are contiguous to each other generally in a plane that is halfway between and parallel to planes 10 and 11; a portion of each prism 31 is "cut off" for this purpose. There is a small space between the adjacent or contiguous regions of the prisms, for example 0.005 inch.

Radiation from source 16 passes through the film or photomask in object plane 10. It is then reflected at roof surfaces 34,35 in such directions that radiation from surface 34 strikes the left side of mirror surface 28 as viewed in FIG. 2, while radiation from surface 35 strikes the right side of such mirror surface 28 as viewed in such figure. Mirror surface 28 reflects such radiation back to the side from which it came, following which prism surface 37 turns the radiation toward plane 11 and the substrate therein.

The positions of the two prisms may be reversed, and the same results will occur.

Magnification Compensator or Adjustor 15

Magnification adjustor or compensator 15 is shown as being disposed in the air gap between image plane 11 and the prism surface 36 nearest thereto. It is formed by two parallel and registered lenses 38,39.

The second lens in the magnification adjustor, number 39, is closer to image plane 11 and is spaced a small distance from lens 38. An actuator, schematically represented at 40 in FIG. 1, is provided to accurately adjust the precise distance between the parallel lenses 38,39. Such adjustment is effected by raising or lowering lens 39 through small distances.

In the preferred magnification compensator or adjustor, lens 38 is plano-concave, while lens 39 is plano-convex. The plane surface of lens 38 is closely adjacent prism surface 36 and parallel thereto. The plane surface of lens 39 is the surface of such lens that is closest to image plane 11. The distance between the facing concave and convex surfaces of lenses 38 and 39, respectively, may be changed slightly by operation of actuator 40, for example in such manner that the spacing between the opposed lenses varies from 0.012 inch to 0.145 inch.

Preferably, the glass type of both lenses 38,39 and both prisms 31,32 is the same. The radius of curvature of the convex surface of the lens 39 is, for example, about 100 inches long.

The magnification compensator 15 makes it practical and effective and high-quality to achieve the precise desired magnification, in order to compensate for shrinkage of layer material that occurs during semiconductor fabrication as the result of multiple layer processing (as previously indicated). Even when the shrinkage is small, about 0.01 percent in a 60 mm by 60 mm field, the dimensional difference between layers can be (for example) 8.4 microns. In order to compensate for such errors, the ability to control magnification is extremely important.

By providing the present magnification compensator in the lens system it is possible to change the desired magnification from 0.9995 (for example) to 1.00002 (for example), thereby compensating for materials shrinkage, with the distortion changing only from 0 to 0.8 microns.

Figure 3:
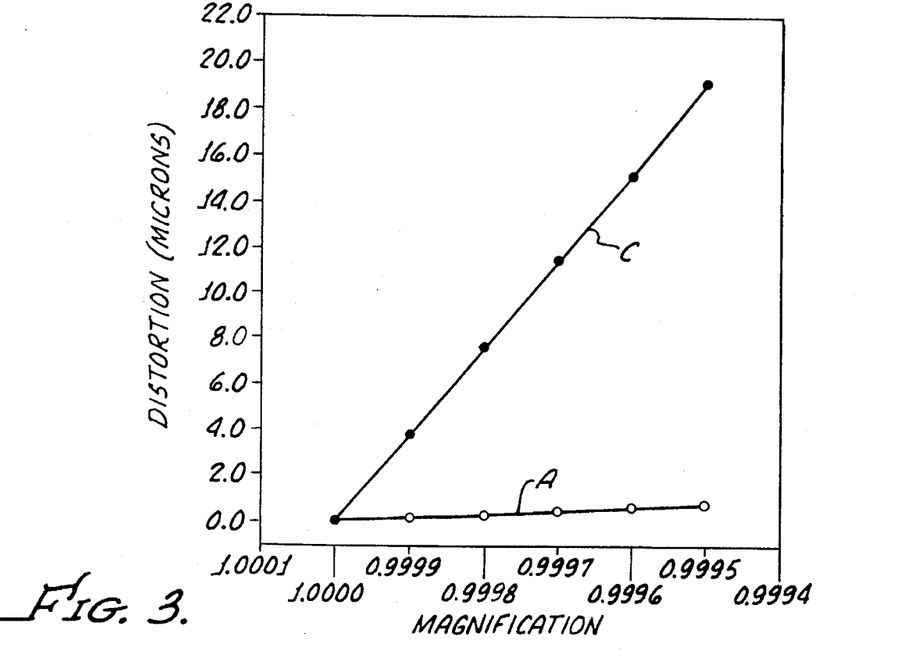
FIG. 3 is a graph showing magnification versus distortion.
Figure 4:
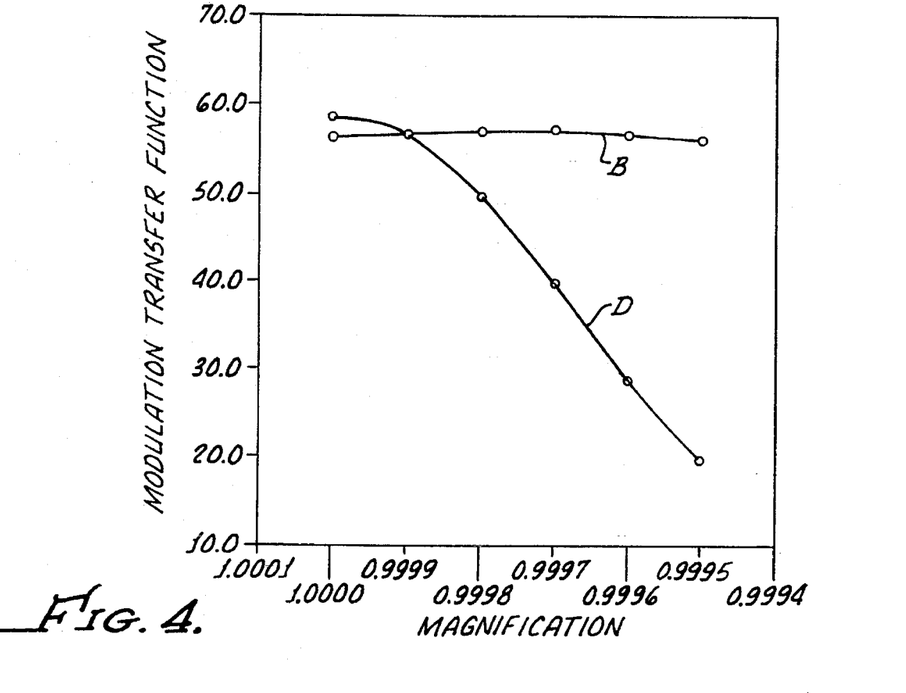
FIG. 4 is a graph showing magnification versus modulation transfer function.

Referring to FIGS. 3 and 4, there are shown graphs, formed by calculation, of magnification versus distortion (FIG. 3), and magnification versus modulation transfer function (FIG. 4). The open "dots" that show the curve A for the system with magnification compensator 15. They illustrate that the distortion is very small and, furthermore, does not change to any substantial extent during a change in magnification from 1.0 to 0.9995 (FIG. 3). Relative to modulation transfer function (FIG. 4), the curve B with the open "dots" again indicates results for present system. They illustrate that change in magnification from 1 to 0.9995 will cause almost no change in modulation transfer function.

The black (solid) "dots" in FIGS. 3 and 4, in curves C and D respectively, indicate substantially what would occur, regarding distortion and modulation transfer function, if magnification change were not effected by the compensator 15 but instead by shifting the entire optical system relative to the object and image planes. Such shifting of the entire optical system would introduce substantial distortion and would degrade resolution dramatically, especially for a scanning system.

Magnification compensator 15 could, alternatively, be disposed in the air gap that is adjacent object plane 10, being then between object plane 10 and the roof prism 31.

Detailed Description of the Magnification Adjustor or Compensator

Figure 5:
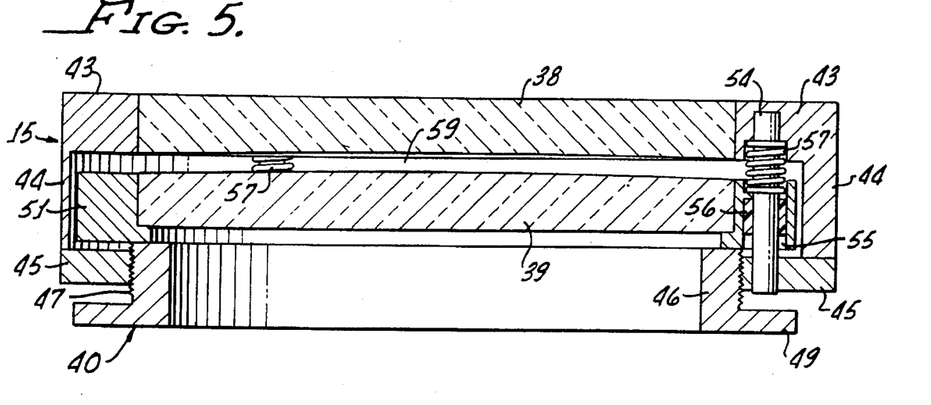
FIG. 5 is a central sectional view illustrating in detail the magnification adjustor or compensator for varying slightly the degree of magnification.

Referring to FIG. 5, one lens, number 38, of magnification adjustor 15 is mounted with its flat surface parallel to and immediately adjacent, or touching, surface 36 of right-angle prism 32. Lens 38 is mounted at its cylindrical periphery in a fixed metal ring 43, such ring having at its outer portion a depending flange 44. Fixedly secured at the bottom of flange 44 is a ring 45 that extends radially-inwardly, so that ring 45 is spaced below and generally parallel to ring 43.

The interior surface of ring 45 is cylindrical and is internally threaded with a very fine thread. Such thread threadedly receives a cylindrical adjustment ring 46 that forms part of the actuator represented schematically at 40 in FIG. 1. The external thread on ring 46 is indicated at 47, and mates with the above-mentioned internal thread in ring 45.

At its lower portion, ring 46 has an outwardly-extending portion 49 that is adapted to be grasped and turned by the operator of the apparatus to adjust magnification.

The upper surface of ring 46 is parallel to lenses 38,39; it supports a movable metal ring 51 in which is mounted the lens 39 that is farthest from prism 32. To hold ring 51 and its associated lens 39 very accurately, in position perpendicular to the optical axis, and thus parallel to lens 38, there are provided three identical assemblies including cylindrical pins 54. The pins extend through rings 43 and 45 in fixed relationship relative to both (as by being press-fit or adhesively secured in holes therein). The pins 54 are spaced about lenses 38,39 at 120-degree angles, namely, 120 degrees from each other.

Moveable ring 51 has, at each pin location, a cylindrical recess 55 that contains, in coaxial relationship, a pin 54. Each recess contains around pin 54 therein a Teflon bushing 56. The upper side of moveable ring 51 is bored and counterbored, and the lower side of ring 43 is counterbored, to receive opposite ends of helical compression springs 57 one of which is shown at the right in FIG. 5. Another (spaced 120-degrees away) is shown toward the left in FIG. 5. The bore in movable ring 51 is precision-sized but just sufficiently large in diameter to permit sliding of such ring relative to the fixed pins 54.

When the actuating ring 46 is turned, even through an extremely small angle of rotation, in such a direction as to move upwardly due to the threaded relationship, ring 51 and thus lens 39 are raised slightly to reduce the space between the two lenses. Conversely, when ring 46 is turned in the opposite direction so as to thread downwardly, ring 51 and lens 39 move in response to the actions of the three springs 57.

The changing of the size of space 59 between the lenses changes very slightly the degree of magnification. For example, the size of space 59 may change between 0.012 and 0.145 (as stated above). Reference is made to the graphs shown in FIGS. 3 and 4 hereof.

Mechanism for Adjusting Image Position

Figures 6, 7, 8:
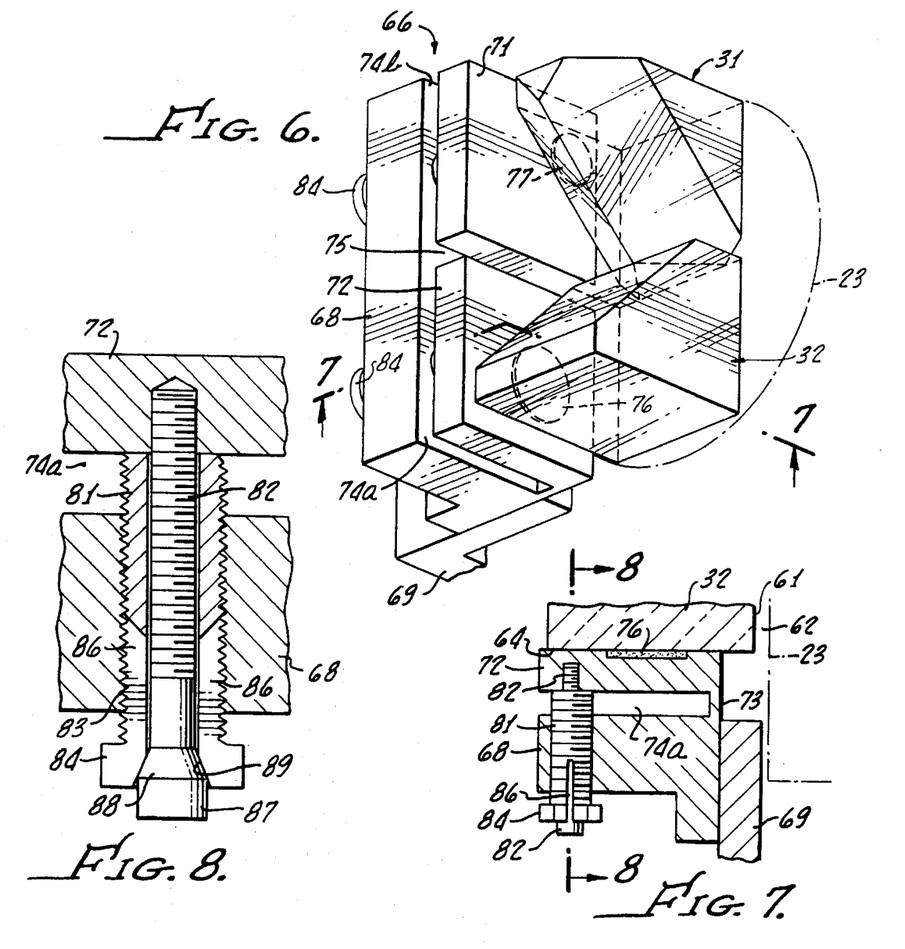
FIG. 6 is an isometric view showing mechanism for supporting the prisms and for achieving very minute adjustments in the position of one prism or the other, or both.
FIG. 7 is a fragmentary sectional view taken on line 7—7 of FIG. 6, and looking in the direction of the arrows.
FIG. 8 is an enlarged fragmentary sectional view on line 8—8 of FIG. 7.

Referring to FIGS. 6–8, the roof prism 31 and right-angle prism 32 have planar faces that are adjacent the planar face of last lens 23. One of these prism faces is shown at 61 in FIG. 7, relative to prism 32, and it is to be understood that prism 31 has a corresponding face that is substantially coplanar with face 61. These faces of prisms 31,32 do not touch the face of last lens 23, being instead separated therefrom by a small gap indicated at 62 in FIG. 7. The size of this gap may be, for example, 0.020 inch.

Prisms 31,32 also have faces that are perpendicular to the just-described faces (such as 61). One of these latter faces is indicated at 64 in FIG. 7, relative to right-angle prism 32, it being understood that roof prism 31 has a corresponding face that is substantially parallel to and substantially coplanar with face 64. Face 64, and the corresponding face of roof prism 31, are rigidly secured, as (for example) by epoxy, to adjustment mechanism next described.

The adjustment mechanism is indicated generally by the reference numeral 66 in FIG. 6. Such mechanism comprises a single block of rigid substance having a low coefficient of thermal expansion. A stainless steel block having a low coefficient of thermal expansion is preferred.

The stainless steel block has a base portion 68 that is strongly and rigidly secured to a strong and rigid support 69 which, in turn, is strongly and rigidly anchored to the main support for the entire lens system. Support 69 also is selected to have a low coefficient of thermal expansion.

The base portion 68 is therefore fixed in position, being used as a base from which to adjust other portions of the adjustment mechanism 66. Such other portions are a first movable element 71 connected to roof prism 31, and a second movable element 72 connected to right-angle prism 32. Elements 71,72 are each associated with base 68 in a very stable and uniform way, including being integral therewith at a somewhat flexible beam or connector 73 (FIG. 7). Each movable element is spaced from base 68 at a gap 74a or 74b, and is parallel to such base.

The two elements 71,72 are separate from each other at a gap 75 therebetween (FIG. 6); there are two separate and distinct—but corresponding—beams 73. One is the beam shown in FIG. 7 and associates base 68 with second element 72. The other beam extends between base 68 and the element 71 for the roof prism.

The entire base, elements 71,72, and beams are machined out of a single piece of stainless steel.

Each beam 73 is relatively stiff and stable, being (for example) 0.062 inch thick and having a dimension perpendicular to base 68 of 0.120 inch.

The first and second movable elements 71,72 are each plates or blocks. They are registered with the halves of base 68 that are on opposite sides of gap 75.

The above-indicated face 64 of prism 32 is secured, as by epoxy, to a planar outer face of plate 72. This is indicated in FIGS. 6 and 7, the epoxy being shown at 76. In like manner, a planar outer face of plate 71 is secured by epoxy to the last-indicated planar face of roof prism 31. This epoxy is shown at 77 in FIG. 6.

The adjacent portions of the two prisms 31,32 are not secured to each other.

Means are provided to effect very fine or low-magnitude adjustments in the positions of the respective plates 71,72 and thus of their associated prisms 31,32, respectively. Referring to FIGS. 7 and 8, the illustrated adjustment means, for each of the plates 71,72, comprises an outer screw 81 having an axial cylindrical (unthreaded) bore, and an inner screw 82 mounted in such bore and also threaded into the associated plate 71 or 72. In FIG. 8, the inner screw is shown as threaded into an internally-threaded bore in plate 72.

Outer screw 81 is threadedly associated with an internally-threaded bore in base 68, by a very fine screw thread 83. The inner end of screw 81 abuts the associated plate 71 or 72. The outer end of screw 81 has a hex head 84 and, furthermore, is longitudinally split at circumferentially-spaced gaps, for a substantial portion of the length of the screw 81. For example, the outer portion of screw 81 has diametrically-opposite gaps 86 that separate the screw into opposed parts which may be spread apart.

Referring next to the inner screw 82, this is solid and is substantially longer than the outer screw, not only extending into the associated element 71 or 72, but having an allen head 87 that is separated by an inwardly-converging frustoconical section 88 with the shank of inner screw 82. Frustoconical section 88 cooperates with an inwardly-convergent frustoconical interior surface 89 of head 84 to spread, and thus lock relative to base 68, the outer portions of outer screw 81.

In the operation of the illustrated adjustment mechanism for adjusting the exact positions of elements 71 and/or 72, and thus prisms 31,32, an allen wrench is first employed to screw outwardly, to some extent, the inner screw 82. Then, a wrench is employed to turn the hex head 84 of the outer screw through a slight distance in order to slightly flex the associated beam 73 and thus minutely turn the related prism 31,32. Then, an allen wrench is employed to turn the inner screw 82 to tighten it in its bore, causing frustoconical section 88 to wedge outwardly the frustoconical surface 89, thus spreading the outer portions of the outer screw and locking the outer screw fixedly in base 68. The method of determining how much to adjust the prism positions (of one or both prisms) is stated under the following method subheading.

Additional Description of the Method

The method of the invention comprises providing a concave mirror and a plano-convex lens in Dyson relationship with each other, and also providing an additional lens spaced from the plano-convex lens a large part of the distance toward the mirror. The method further comprises directing radiation, from a lamp or other source, through the plano-convex lens and the additional lens to the mirror—the radiation then being reflected back through the additional lens and plano-convex lens and being directed to an image plane.

In accordance with another aspect of the method, the plano-convex lens is closely associated with a concavo-convex lens, and all three lenses are constructed from different glass types in such manner as to minimize chromatic and other aberrations. The radiation from the source passes through the plano-convex lens, then the concavo-convex lens, and then the additional lens to the mirror, the additional lens being a meniscus lens. The concave mirror surface is, in accordance with one aspect of the method, caused to be slightly aspherical in order to cooperate with the lenses for reduction of chromatic and others aberrations.

In accordance with another aspect, the radiation is directed by a roof prism and an angle prism that cooperate with the lenses and mirror to cause the object and image to have the same orientation in object and image planes, so that scanning may occur. In the greatly preferred form, the angle prism is a right-angle prism and the object and image planes are parallel to each other for scanning purposes.

The method further comprises, in its greatly preferred form, creating a large air gap between a prism and one of the object and image planes. It further comprises disposing a magnification adjustor or compensator in that air gap, and causing the field to be large in cross-sectional area. Furthermore, the field is caused to have a desired nesting shape in the preferred scanning embodiment.

The method further comprises causing the NA to be large for the indicated Dyson system, to achieve excellent resolution at the image plane.

The method further comprises mapping (as by a computer) the surface of (for example) a semiconductor wafer in each batch thereof, and determining the average amount of shrinkage of such wafer as the result of process steps during fabrication. The method further comprises so setting the magnification adjustor—in response to such average—that there is good correlation between the size of the object represented in the mask at the object plane, and the size of the image at the wafer (or other substrate) at the image plane.

In accordance with another aspect of the method, there is caused to be extreme accuracy in the position of the image at the image plane, vis-a-vis the position of the object at the object plane—there being no "twist" that causes points at the image plane to be out of desired superposed (superimposed) conditions during adjacent partially-overlapping scans.

To achieve this, the method comprises causing a very fine point or line in the mask in object plane 10 to be projected, as part of the field, by the Dyson system, onto a substrate (or a test film) mounted in the image plane 11 of scanning microlithographic apparatus. The method further comprises then relatively moving the field (i.e. causing relative movement to occur between the Dyson system on the one hand, and the mask and substrate on the other) to a position (1) at which the moved field only partially overlaps the field mentioned above in this paragraph, and (2) at which the above-indicated projected fine point or line should (under conditions of high accuracy) be superposed on the first-mentioned projected point or line. (For example, in the scanning system in which adjacent scans (called the first and second scans) partially overlap each other so that at least certain regions of the substrate are exposed twice (once by the "first scan" and once by the "second scan"), it is known that the image of a point or line during the first scan should register—at a particular scanning position—with the image of the same point or line during the second scan.) Then, if there is not perfect registry of the "two" points or lines, the method comprises physically adjusting the position of one or both of the prisms, as by using the mechanism described herein, until registry of the "two" points or lines is effected. When perfect registry is achieved, by repeating the above steps, it is known that that very scanning apparatus (the one in which the testing was performed) is in its most accurate condition. The method is then repeated for each scanning apparatus being manufactured.

The method further comprises, in one of its aspects, sequentially performing the above steps for two points at opposite end portions of the field, so that substantially perfect twist-free alignment of the image is achieved.

| Specific Illustration Number 1 | | | | |
|---|---|---|---|---|
| 0.40500 = Wvlg(1) | 0.36000 = Wvlg(2) | 0.44000 = Wvlg(3) | | |
| No.* | Parameter* Kind* | Axl. Seprtn.* | Ca. Rd.* | Gl.Code* Name* |
| 0 | Object Sfce | 1.3000-in | 0.000 | |
| 1 | Plano | 0.2500-in | 4.175 | 1458.673 SiO2 |
| 2 | Plano | 0.0150-in | 4.199 | |
| 3 | Plano | 6.2000-in | 4.201 | 1458.673 SiO2 |
| 4 | Plano | 0.0150-in | 4.787 | |
| 5 | Plano | 2.2000-in | 4.789 | 1458.673 SiO2 |
| 6 | −7.4755-in SP | 0.0458-in | 4.830 | |
| 7 | −7.4697-in SP | 1.0000-in | 4.812 | 532.488 LLF6 |
| 8 | −16.6781-in SP | 9.0373-in | 5.067 | |
| 9 | −61.0895-in SP | 1.5000-in | 5.330 | 620.364 F2 |
| 10 | −46.9792-in SP | 32.6623-in | 5.403 | |
| 11 | −54.0974-in A1 | 0.0000-in | 5.771 | mirror |
| 12 | Aperture Stop | −32.6623-in | 5.774 | |
| 13 | −46.9792-in SP | −1.5000-in | 5.429 | 620.364 F2 |
| 14 | −61.0895-in SP | −9.0373-in | 5.355 | |
| 15 | −16.6781-in SP | −1.0000-in | 5.078 | 532.488 LLF6 |
| 16 | −7.4697-in SP | −0.0458-in | 4.821 | |
| 17 | −7.4755-in SP | −2.2000-in | 4.839 | 1458.673 SiO2 |
| 18 | Plano | −0.0150-in | 4.798 | |
| 19 | Plano | −5.6500-in | 4.796 | 1458.673 SiO2 |
| 20 | Plano | −0.0150-in | 4.256 | |
| 21 | −2.2772-in YD | 0.0000-in | 0.000 | |
| 22 | Plano | −0.4000-in | 2.536 | 1458.673 SiO2 |
| 23 | 120.6273-in SP | −0.1434-in | 2.496 | |
| 24 | 119.3033-in SP | −0.4000-in | 2.477 | 1458.673 SiO2 |
| 25 | Plano | 0.0000-in | 2.441 | |
| 26 | 2.2772-in YD | −1.1553-in | 0.000 | |
| 27 | Image Plane | 0.0000-in | 0.000 | |
| | Table of Constants | | | |
| 11 | −8.741893E-02 | 0.000000E+00 | | 0.000000E+00 |
| | 0.000000E+00 | 0.000000E+0 | | |

In the above table, and in subsequent tables, "SP" means spherical; "A1" means standard aspheric; "YD" means y-decenter; "Axl.Seprtn." means axial separation; "Ca.Rd." means clear aperture radius; and "Gl." means glass.

Specific Example of Aspheric (Aspherical) Mirror Surface
Of This Specific Illustration Number 1
CURVATURE = −0.0184852
SURFACE = 11
Conic constant: K = −8.741893E−02
Aspheric coefficients:
A( 4) = 0.000000E + 00
A( 6) = 0.000000E + 00
A( 8) = 0.000000E + 00
A(10) = 0.000000E + 00
ASPHERIC SAG TABLE

| ZONAL RADIUS (in) | ASPHERIC SAG (in) | SPHERIC SAG (in) | ASPH-SPH SAG (in)*E + 03 | RINGS (632.NM) |
|---|---|---|---|---|
| 5.800000 | −0.311741 | −0.311741 | 0.000000 | 0.00 |
| 5.510000 | −0.281273 | −0.281266 | −0.006958 | −0.56 |
| 5.220000 | −0.252383 | −0.252371 | −0.012158 | −0.98 |
| 4.930000 | −0.225068 | −0.225052 | −0.015823 | −1.27 |
| 4.640000 | −0.199324 | −0.199306 | −0.018167 | −1.46 |
| 4.350000 | −0.175152 | −0.175132 | −0.019388 | −1.56 |
| 4.060000 | −0.152547 | −0.152528 | −0.019672 | −1.58 |
| 3.770000 | −0.131510 | −0.131491 | −0.019193 | −1.54 |
| 3.480000 | −0.112037 | −0.112019 | −0.018111 | −1.45 |
| 3.190000 | −0.094128 | −0.094112 | −0.016575 | −1.33 |
| 2.900000 | −0.077781 | −0.077767 | −0.014721 | −1.18 |
| 2.610000 | −0.062995 | −0.062982 | −0.012672 | −1.02 |
| 2.320000 | −0.049768 | −0.049758 | −0.010541 | −0.85 |
| 2.030000 | −0.038100 | −0.038092 | −0.008428 | −0.68 |
| 1.740000 | −0.027989 | −0.027983 | −0.006419 | −0.52 |
| 1.450000 | −0.019436 | −0.019431 | −0.004591 | −0.37 |
| 1.160000 | −0.012438 | −0.012435 | −0.003008 | −0.24 |
| 0.870000 | −0.006996 | −0.006994 | −0.001722 | −0.14 |
| 0.580000 | −0.003109 | −0.003109 | −0.000775 | −0.06 |
| 0.290000 | −0.000777 | −0.000777 | −0.000195 | −0.02 |
| 0.000000 | 0.000000 | 0.000000 | 0.000000 | 0.00 |

−54.0973729 = VERTEX RADIUS
−54.1109989 = NEAREST SPHERE RADIUS
−54.1109989 = BASE RADIUS

PARAMETERS OF THE ELLIPSE
SHORT FOCUS = −41.75253076
LONG FOCUS = −76.80652003
MAJOR SEMIDIAMETER = −59.27952539
MINOR SEMIDIAMETER = 56.62920263

ASPHERIC SURFACE DEFINED BY:

C = −0.018485 (VERTEX RADIUS = 1/C = −54.097373)
K = −8.741893E−02
$A_4$ = 0.000000E + 00
$A_6$ = 0.000000E + 00
$A_8$ = 0.000000E + 00
$A_{10}$ = 0.000000E + 00
VERIFICATION TABLE

| RADIUS (Y) | SAG (Z) |
|---|---|
| 5.800 | −0.311741 |
| 4.640 | −0.199324 |
| 3.480 | −0.112037 |
| 2.320 | −0.049768 |
| 1.160 | −0.012438 |
| 0.000 | 0.000000 |

$$Z = \frac{CY^2}{1 + \sqrt{1 - (K+1)^2 C^2 Y}} + A_4 Y^4 + A_6 Y^6 + A_8 Y^8 + A_{10} Y^{10}$$

Relative to performance of the lens system, the following data apply, primarily relative to the above-stated Specific Illustration Number 1: the corrected bandpass is 350–450 nm; the alignment bandpass is 350–600 nm; the Strehl ratio is 0.98; the maximum usable linewidth is 2.0 µm; the depth of focus (2.5 µm line) is 12 µm; the telecentricity is less than 2.0 mrad; the magnification is 0.9995–1.0005; and the distortion is less than 0.3 µm.

Specific Illustration Number 2
0.40500 = Wvlg(1)   0.36000 = Wvlg(2)   0.44000 = Wvlg(3)

| No.* | Parameter* Kind* | Axl.Seprtn.* | Ca.Rd.* | Gl.Code* | Name* | Popular Name* |
|---|---|---|---|---|---|---|
| 0 | Object Sfce | 1.3000-in | 0.000 | | | |
| 1 | Plano | 0.2500-in | 4.183 | 464.658 | FK3 | Flour Crown |
| 2 | Plano | 0.0150-in | 4.207 | | | |
| 3 | Plano | 5.6741-in | 4.209 | 464.658 | FK3 | Flour Crown |
| 4 | Plano | 0.0150-in | 4.748 | | | |
| 5 | −384.3504-in SP | 1.9780-in | 4.746 | 464.658 | FK3 | Flour Crown |
| 6 | −7.0294-in SP | 0.0081-in | 4.761 | | | |
| 7 | −7.0230-in SP | 1.1995-in | 4.757 | 532.488 | LLF6 | Extra Light Flint |
| 8 | −15.9035-in SP | 10.4033-in | 5.059 | | | |
| 9 | −49.4672-in SP | 1.5000-in | 5.362 | 620.364 | F2 | Flint |
| 10 | −42.0077-in SP | 32.5215-in | 5.448 | | | |
| 11 | Aperture Stop | 0.0000-in | 5.897 | | | |
| 12 | −54.6869-in Al | −32.5215-in | 5.892 | mirror | | |
| 13 | −42.0077-in SP | −1.5000-in | 5.425 | 620.364 | F2 | Flint |
| 14 | −49.4672-in SP | −10.4033-in | 5.340 | | | |
| 15 | −15.9035-in SP | −1.1995-in | 5.050 | 532.488 | LLF6 | Extra Light Flint |
| 16 | −7.0230-in SP | −0.0081-in | 4.751 | | | |
| 17 | −7.0294-in SP | −1.9780-in | 4.754 | 464.658 | FK3 | Flour Crown |
| 18 | −384.3504-in SP | −0.0150-in | 4.739 | | | |
| 19 | Plano | −5.6741-in | 4.741 | 464.658 | FK3 | Flour Crown |
| 20 | Plano | −0.0150-in | 4.207 | | | |
| 21 | Plano | −0.2500-in | 4.205 | 464.658 | FK3 | Flour Crown |
| 22 | Plano | −1.3000-in | 4.182 | | | |
| 23 | Image Plane | 0.0000-in | 4.000 | | | |

Table of Constants

| 12 | −6.093758E−02 | 0.000000E+00 | 0.000000E+00 | 0.000000E+00 | 0.000000E+0 |

Specific Example of Aspheric (Aspherical) Mirror Surface
Of This Specific Illustration Number 2
CURVATURE = −0.0182859
SURFACE = 12
Conic constant: K = −6.093758E−02
Aspheric coefficients:
A( 4) = 0.000000E + 00
A( 6) = 0.000000E + 00
A( 8) = 0.000000E + 00
A(10) = 0.000000E + 00
ASPHERIC SAG TABLE

| ZONAL RADIUS (in) | ASPHERIC SAG (in) | SPHERIC SAG (in) | ASPH-SPH SAG (in)*E + 03 | RINGS (632.NM) |
|---|---|---|---|---|
| 6.000000 | −0.330082 | −0.330082 | 0.000000 | 0.00 |
| 5.700000 | −0.297816 | −0.297811 | −0.005382 | −0.43 |
| 5.400000 | −0.267222 | −0.267212 | −0.009403 | −0.75 |
| 5.100000 | −0.238296 | −0.238284 | −0.012237 | −0.98 |
| 4.800000 | −0.211036 | −0.211022 | −0.014049 | −1.13 |
| 4.500000 | −0.185440 | −0.185425 | −0.014992 | −1.20 |
| 4.200000 | −0.161506 | −0.161490 | −0.015211 | −1.22 |
| 3.900000 | −0.139231 | −0.139216 | −0.014840 | −1.19 |
| 3.600000 | −0.118613 | −0.118599 | −0.014003 | −1.12 |
| 3.300000 | −0.099652 | −0.099639 | −0.012815 | −1.03 |
| 3.000000 | −0.082345 | −0.082333 | −0.011381 | −0.91 |
| 2.700000 | −0.066690 | −0.066681 | −0.009797 | −0.79 |
| 2.400000 | −0.052687 | −0.052679 | −0.008149 | −0.65 |
| 2.100000 | −0.040334 | −0.040328 | −0.006515 | −0.52 |
| 1.800000 | −0.029631 | −0.029626 | −0.004962 | −0.40 |
| 1.500000 | −0.020575 | −0.020572 | −0.003549 | −0.28 |
| 1.200000 | −0.013167 | −0.013165 | −0.002325 | −0.19 |
| 0.900000 | −0.007406 | −0.007405 | −0.001331 | −0.11 |
| 0.600000 | −0.003292 | −0.003291 | −0.000599 | −0.05 |
| 0.300000 | −0.000823 | −0.000823 | −0.000151 | −0.01 |
| 0.000000 | 0.000000 | 0.000000 | 0.000000 | 0.00 |

−54.6869266 = VERTEX RADIUS
−54.6969838 = NEAREST SPHERE RADIUS
−54.6969838 = BASE RADIUS
PARAMETERS OF THE ELLIPSE
SHORT FOCUS = −43.85987913
LONG FOCUS = −72.61145580
MAJOR SEMIDIAMETER = −58.23566746
MINOR SEMIDIAMETER = 56.43340920

ASPHERIC SURFACE DEFINED BY:

C = −0.01 8286 (VERTEX RADIUS = 1/C = −54.686927)
K = −6.093758E-02
$A_4$ = 0.000000E + 00
$A_6$ = 0.000000E + 00
$A_8$ = 0.000000E + 00
$A_{10}$ = 0.000000E + 00
VERIFICATION TABLE

| RADIUS (Y) | SAG (Z) |
|---|---|
| 5.900 | −0.319141 |
| 4.720 | −0.204048 |
| 3.540 | −0.114689 |
| 2.360 | −0.050945 |
| 1.180 | −0.012732 |
| 0.000 | 0.000000 |

$$Z = \frac{CY^2}{1 + \sqrt{1 - (K+1)^2 C^2 Y}} + A_4 Y^4 + A_6 Y^6 + A_8 Y^8 + A_{10} Y^{10}$$

Specific Illustration Number 3
0.40500 = Wvlg(1)    0.36000 = Wvlg(2)    0.44000 = Wvlg(3)

| No.* | Parameter* Kind* | Axl.Seprtn.* | Ca.Rd.* | Gl.Code* | Name* | Popular Name* |
|---|---|---|---|---|---|---|
| 0 | Object Sfce | 1.2000-in | 0.000 | | | |
| 1 | Plano | 0.2500-in | 4.177 | 1458.673 | SiO2 | Fused Silica |
| 2 | Plano | 0.0150-in | 4.202 | | | |
| 3 | Plano | 6.2000-in | 4.204 | 1458.673 | SiO2 | Fused Silica |
| 4 | Plano | 0.0150-in | 4.822 | | | |
| 5 | −635.5945-in SP | 2.2000-in | 4.822 | 1458.673 | SiO2 | Fused Silica |
| 6 | −7.2555-in SP | 0.0012-in | 4.858 | | | |
| 7 | −7.2571-in SP | 1.1740-in | 4.857 | 532.488 | LLF6 | Extra Light Flint |
| 8 | −16.3562-in SP | 9.9246-in | 5.166 | | | |
| 9 | −46.9847-in SP | 1.5000-in | 5.551 | 1596.392 | PBM 8 | Flint |
| 10 | −38.5809-in SP | 32.5203-in | 5.648 | | | |
| 11 | Aperture Stop | 0.0000-in | 6.273 | | | |
| 12 | −55.0431-in Al | −32.5203-in | 6.267 | mirror | | |
| 13 | −38.5809-in SP | −1.5000-in | 5.621 | 1596.392 | PBM 8 | Flint |
| 14 | −46.9847-in SP | −9.9246-in | 5.526 | | | |
| 15 | −16.3562-in SP | −1.1740-in | 5.154 | 532.488 | LLF6 | Extra Light Flint |
| 16 | −7.2571-in SP | −0.0012-in | 4.849 | | | |
| 17 | −7.2555-in SP | −2.2000-in | 4.849 | 1458.673 | SiO2 | Fused Silica |
| 18 | −635.5945-in SP | −0.0150-in | 4.813 | | | |
| 19 | Plano | −6.2000-in | 4.814 | 1458.673 | SiO2 | Fused Silica |
| 20 | Plano | −0.0150-in | 4.202 | | | |
| 21 | Plano | −0.2500-in | 4.200 | 1458.673 | SiO2 | Fused Silica |
| 22 | Plano | −1.2000-in | 4.175 | | | |
| 23 | Image Plane | 0.0000-in | 4.000 | | | |

Table of Constants

| 12 | −6.824965E−02 | 0.000000E+00 | 0.000000E+00 | 0.000000E+00 | 0.000000E+0 |

Specific Example of Aspheric (Aspherical) Mirror Surface
Of This Specific Illustration Number 3
CURVATURE = −0.0181676
SURFACE = 12
Conic constant: K = −6.824965E-02
Aspheric coefficients:
A( 4) = 0.000000E + 00
A( 6) = 0.000000E + 00
A( 8) = 0.000000E + 00
A(10) = 0.000000E + 00
ASPHERIC SAG TABLE

| ZONAL RADIUS (in) | ASPHERIC SAG (in) | SPHERIC SAG (in) | ASPH-SPH SAG (in)*E + 03 | RINGS (632.NM) |
|---|---|---|---|---|
| 6.300000 | −0.361642 | −0.361642 | 0.000000 | 0.00 |
| 5.985000 | −0.326284 | −0.326277 | −0.007193 | −0.58 |
| 5.670000 | −0.292759 | −0.292747 | −0.012566 | −1.01 |
| 5.355000 | −0.261064 | −0.261047 | −0.016353 | −1.31 |
| 5.040000 | −0.231195 | −0.231176 | −0.018772 | −1.51 |
| 4.725000 | −0.203150 | −0.203130 | −0.020031 | −1.61 |
| 4.410000 | −0.176927 | −0.176907 | −0.020322 | −1.63 |
| 4.095000 | −0.152523 | −0.152503 | −0.019825 | −1.59 |
| 3.780000 | −0.129936 | −0.129917 | −0.018705 | −1.50 |
| 3.465000 | −0.109163 | −0.109146 | −0.017117 | −1.37 |
| 3.150000 | −0.090203 | −0.090188 | −0.015201 | −1.22 |
| 2.835000 | −0.073054 | −0.073041 | −0.013085 | −1.05 |
| 2.520000 | −0.057714 | −0.057703 | −0.010884 | −0.87 |
| 2.205000 | −0.044182 | −0.044173 | −0.008701 | −0.70 |
| 1.890000 | −0.032457 | −0.032450 | −0.006626 | −0.53 |
| 1.575000 | −0.022538 | −0.022533 | −0.004739 | −0.38 |
| 1.260000 | −0.014423 | −0.014420 | −0.003105 | −0.25 |
| 0.945000 | −0.008113 | −0.008111 | −0.001778 | −0.14 |
| 0.630000 | −0.003605 | −0.003605 | −0.000800 | −0.06 |
| 0.315000 | −0.000901 | −0.000901 | −0.000202 | −0.02 |
| 0.000000 | 0.000000 | 0.000000 | 0.000000 | 0.00 |

−55.0431376 = VERTEX RADIUS
−55.0554786 = NEAREST SPHERE RADIUS
−55.0554786 = BASE RADIUS
PARAMETERS OF THE ELLIPSE
SHORT FOCUS = −43.64186137
LONG FOCUS = −74.50810733
MAJOR SEMIDIAMETER = −59.07498435
MINOR SEMIDIAMETER =  57.02343809

ASPHERIC SURFACE DEFINED BY:

C = −0.018168 (VERTEX RADIUS = 1/C = −55.043138)
K = −6.824965E-02
$A_4$ = 0.000000E + 00
$A_6$ = 0.000000E + 00
$A_8$ = 0.000000E + 00
$A_{10}$ = 0.000000E + 00
VERIFICATION TABLE

| RADIUS (Y) | SAG (Z) |
|---|---|
| 6.300 | −0.361642 |
| 5.040 | −0.231195 |
| 3.780 | −0.129936 |
| 2.520 | −0.057714 |
| 1.260 | −0.014423 |
| 0.000 | 0.000000 |

$$Z = \frac{CY^2}{1 + \sqrt{1-(K+1)^2 C^2 Y}} + A_4 Y^4 + A_6 Y^6 + A_8 Y^8 + A_{10} Y^{10}$$

The magnification compensator or adjuster, 15, is not present in Specific Illustration Number 2 or in Specific Illustration Number 3.

The invention is described and shown herein as employed in a scanning microlithographic system, in which the object and image planes are parallel to each other and the image has the same orientation as the object. It is to be understood that, for other types of systems, changes may be made and still incorporate some of the inventive aspects of the present disclosure. For example, in a nonscanning system the object and image planes need not be parallel and the right-angle prism may be a suitable turning prism or mirror the angle of which is not necessarily 90 degrees. It is also to be understood that, to reduce costs while also losing an important inventive aspect disclosed herein, the magnification adjustor may be omitted.

The foregoing detailed description is to be clearly understood as given by way of illustration and example only, the spirit and scope of this invention being limited solely by the appended claims.

What is claimed is:

1. A Dyson lens system, which comprise:
   a primary mirror having a substantially spherical concave mirror surface on one side thereof,
   a radiation source that passes radiation through an object plane,
   a lens group disposed on the same side as said mirror surface, and spaced from said mirror surface,
   means to direct said radiation from said source thereof to said lens group,
      said lens group and said mirror surface being so constructed that said radiation passes through said lens group to said mirror surface and is reflected back from said mirror surface through said lens group, and
   means to direct said reflected radiation from said lens group to an image plane,
      said lens group including a first lens and a second lens,
      said second lens being between said first lens and said mirror surface, and being spaced from said first lens a large part of the distance from said first lens to said mirror surface,
         said large part of the distance from said first lens to said mirror surface being at least substantially one-quarter of the distance from said first lens to said mirror surface,
      said mirror surface and said lens group being constructed and arranged generally in Dyson relationship, and producing a substantially one-to-one image at said image plane.

2. The invention as claimed in claim 1, in which said mirror surface is slightly aspherical.

3. The invention as claimed in claim 1, in which said second lens is a meniscus lens having its convex surface facing said mirror surface.

4. The invention as claimed in claim 1, in which said first lens is a plano-convex lens having its convex surface facing toward said mirror surface, and further is a concavo-convex lens having its convex surface facing toward said mirror surface, said concavo-convex lens being between said plano-convex lens and said second lens.

5. The invention as claimed in claim 1, in which said first lens and second lens collectively comprise three lenses each of which is formed of a different glass type than the others, and forming an apochromatic assembly.

6. The invention as claimed in claim 5, in which said concave mirror surface is slightly aspherical and cooperates with said apochromatic assembly to reduce chromatic and other aberrations.

7. The invention as claimed in claim 1, in which said second lens is a meniscus lens having its convex surface facing said mirror surface, in which said first lens comprises two lenses, one of said two lenses in said first lens being a plano-convex lens having its convex surface facing toward said mirror surface, the other of said two lenses in said first lens being a concavo-convex lens having its convex surface facing toward said mirror surface, said concavo-convex lens being between said plano-convex lens and said meniscus lens, said plano-convex lens and concavo-convex lens being close to each other.

8. The invention as claimed in claim 7, in which said meniscus lens, said plano-convex lens and said concavo-convex lens are each made of a glass type different from that of the others, said lenses forming an apochromatic assembly.

9. The invention as claimed in claim 8, in which said mirror surface is slightly aspherical.

10. The invention as claimed in claim 1, in which said second lens is a thick meniscus lens.

11. The invention as claimed in claim 1, in which said second lens is spaced about one-quarter of the distance from said first lens to said mirror surface.

12. The invention as claimed in claim 1, in which said second lens is spaced about one-third of the distance from said first lens to said mirror surface.

13. The invention as claimed in claim 1, in which said second lens is a thick meniscus lens having its convex surface facing said mirror surface, in which said first lens comprises a plano-convex lens element having its convex surface facing toward said mirror surface, and also comprises a concavo-convex lens element having its convex surface facing toward said mirror surface, in which said concavo-convex lens element is between said plano-convex lens element and said thick meniscus lens, in which said plano-convex lens element and concavo-convex lens element are close to each other, in which said mirror surface is slightly aspherical, and in which said thick meniscus lens is spaced about one-quarter of the distance from said plano-convex lens element to said mirror surface.

14. The invention as claimed in claim 1, in which said second lens is a thick meniscus lens having its convex surface facing said mirror surface, in which said first lens comprises a plano-convex lens element having its convex surface facing toward said mirror surface, and also comprises a concavo-convex lens element having its convex surface facing toward said mirror surface, in which said concavo-convex lens element is between said plano-convex lens element and said thick meniscus lens, in which said plano-convex lens element and concavo-convex lens element are close to each other, in which said mirror surface is slightly aspherical, and in which said thick meniscus lens is spaced about one-third of the distance from said plano-convex lens element to said mirror surface.

15. A Dyson lens system, which comprises:

a primary mirror having a substantially spherical concave mirror surface on one side thereof, a radiation source that passes radiation through an object plane, a lens group disposed on the same side as said mirror surface, and spaced from said mirror surface, means to direct said radiation from said source thereof to said lens group,
   said lens group and said mirror surface being so constructed that said radiation passes through said lens group to said mirror surface and is reflected back from said mirror surface through said lens group, and means to direct said reflected radiation from said lens group to an image plane,
   said means to direct radiation from said source to said lens group, and to direct reflected radiation from said lens group to an image plane, comprising a roof prism and a turning prism,
   said lens group including a first lens and a second lens,
      said second lens being between said first lens and said mirror surface, and being spaced from said first lens a large part of the distance from said first lens to said mirror surface,
      said mirror surface and said lens group being constructed and arranged generally in Dyson relationship, and producing a substantially one-to-one image at said image plane.

16. A Dyson lens system, which comprise:

a primary mirror having a substantially spherical concave mirror surface on one side thereof, a radiation source that passes radiation through an object plane, a lens group disposed on the same side as said mirror surface, and spaced from said mirror surface, means to direct said radiation from said source thereof to said lens group,
   said lens group and said mirror surface being so constructed that said radiation passes through said lens group to said mirror surface and is reflected back from said mirror surface through said lens group, means to direct said reflected radiation from said group to an image plane,
   said lens group including a first lens and a second lens,
      said second lens being between said first lens and said mirror surface, and being spaced from said first lens a large part of the distance from said first lens to said mirror surface,
      said mirror surface and said lens group being constructed and arranged generally in Dyson relationship, and producing a substantially one-to-one image at said image plane, and a magnification adjustor to effect slight changes in the magnification ratio of the Dyson system,
   said magnification adjustor being between one of said means to direct and one of said image plane and said object plane.

17. The invention as claimed in claim 16 in which said magnification adjustor comprises two spaced-apart adjustor lenses disposed parallel to each other, and actuating means to adjust slightly the distance between said two adjustor lenses.

18. The invention as claimed in claim 17, in which said means to direct radiation from a source to said lens group, and to direct reflected radiation from said lens group to an image plane, comprises a roof prism and a right-angle prism disposed adjacent said lens group, and in which said two adjustor lenses, and the actuating means for adjusting the distance between them, are disposed between said prisms and one of said image plane and said object plane.

19. A Dyson lens system, which comprises:

a primary mirror having a substantially spherical concave mirror surface on one side thereof, a radiation source that passes radiation through an object plane, a lens group disposed on the same side as said mirror surface, and spaced from said mirror surface, means to direct said radiation from said source thereof to said lens group,
   said lens group and said mirror surface being so constructed that said radiation passes through said lens group to said mirror surface and is reflected back from said mirror surface through said lens group, means to direct said reflected radiation from said lens group to an image plane, said lens group including a first lens and a second lens,
said second lens being between said first lens and said mirror surface, and being spaced from said first lens a large part of the distance from said first lens to said mirror surface,
said mirror surface and said lens group being constructed and arranged generally in Dyson relationship, and producing a substantially one-to-one image at said image plane,
said first lens comprising a plano-convex lens element having its convex surface facing toward said mirror surface, and further comprising a concavo-convex lens element having its convex surface facing toward said mirror surface, said concavo-convex lens element being between said plano-convex lens element and said second lens, said first lens being a doublet.

20. A Dyson lens system, which comprises:
a primary mirror having an aspherical concave mirror surface on one side thereof,
a radiation source that passes radiation through an object plane,
a lens group disposed on the same side as said mirror surface, and spaced from said mirror surface,
means to direct said radiation from said source thereof to said lens group,
said lens group and said mirror surface being so constructed that said radiation passes through said lens group to said mirror surface and is reflected back from said mirror surface through said lens group,
means to direct said reflected radiation from said lens group to an image plane,
said lens group including a first lens and a second lens,
said second lens being between said first lens and said mirror surface, and being spaced from said first lens a large part of the distance from said first lens to said mirror surface,
said mirror surface and said lens group being constructed and arranged generally in Dyson relationship, and producing a substantially one-to-one image at said image plane,
said first lens comprising being a plano-convex lens element having its convex surface facing toward said mirror surface, and further comprising a concavo-convex lens element having its convex surface facing toward said mirror surface, said concavo-convex lens element being between said plano-convex lens element and said second lens, said first lens being a doublet.

21. A Dyson lens system, which comprises:
a primary mirror having an aspherical concave mirror surface on one side thereof,
a radiation source that passes radiation through an object plane,
a lens group disposed on the same side as said mirror surface, and spaced from said mirror surface,
means to direct said radiation from said source thereof to said lens group,
said lens group and said mirror surface being so constructed that said radiation passes through said lens group to said mirror surface and is reflected back from said mirror surface through said lens group,
means to direct said reflected radiation from said lens group to an image plane, said lens group including a first lens and a second lens,
said second lens being between said first lens and said mirror surface, and being spaced from said first lens a large part of the distance from said first lens to said mirror surface,
said mirror surface and said lens group being constructed and arranged generally in Dyson relationship, and producing a substantially one-to-one image at said image plane,
said first lens comprising a plano-convex lens element having its convex surface facing toward said mirror surface, and further comprising a concavo-convex lens element having its convex surface facing toward said mirror surface, said concavo-convex lens element being between said plano-convex lens element and said second lens, said first lens being a doublet
said second lens being a thick meniscus lens.

22. The invention as claimed in any of claims 1–9, 15, 19, 20, 10, 21, 11, 12, 13, 14, in which the space between said second lens and said mirror surface is an air gap, and in which the space between said first lens and said second lens is an air gap.

23. A Dyson lens system, comprising:
a primary mirror having a concave mirror surface,
a plano-convex lens spaced a large distance from said mirror surface,
said plano-convex lens having its convex surface facing said mirror surface and having the same optical axis as said mirror surface,
a concavo-convex lens element having its convex surface facing said mirror surface,
said concavo-convex lens having said optical axis and being between said plano-convex lens and said mirror surface,
a meniscus lens having said optical axis and being disposed between said concavo-convex lens and said mirror surface,
said meniscus lens being spaced from said concavo-convex lens a large part of the distance from said concavo-convex lens to said mirror surface,
the convex surface of said meniscus lens facing said mirror surface,
a light source,
a first prism to direct light from said source through said lenses from which it passes to said mirror surface,
said light reflecting from said mirror surface and passing back through said lenses, and
a second prism to direct to an image plane said light that reflects from said mirror surface and passes back through said lenses.

24. The invention as claimed in claim 23, in which said mirror surface is slightly aspherical.

25. The invention as claimed in claim 24, in which said meniscus lens is a thick meniscus lens.

26. The invention as claimed in claim 23, in which there are provided means to adjust precisely the position of at least one of said prisms.

27. The invention as claimed in claim 23, in which said plano-convex lens and said concavo-convex lens are formed of different glass types.

28. The invention as claimed in claim 23, in which said meniscus lens is a thick meniscus lens.

29. The invention as claimed in claim 28, in which said thick meniscus lens is spaced about one-quarter of the distance from said plano-convex lens to said mirror surface.

30. The invention as claimed in claim 28, in which said thick meniscus lens is spaced about one-third of the distance from said plano-convex lens to said mirror surface.

31. The invention as claimed in claim 23, in which said meniscus lens is spaced about one-quarter of the distance from said plano-convex lens to said mirror surface.

32. The invention as claimed in claim 23, in which said meniscus lens is spaced about one-third of the distance from said plano-convex lens to said mirror surface.

33. A Dyson lens system, comprising:
   a primary mirror having a concave mirror surface,
   a plano-convex lens spaced a large distance from said mirror surface,
      said plano-convex lens having its convex surface facing said mirror surface and having the same optical axis as said mirror surface,
   a concavo-convex lens having its convex surface facing said mirror surface,
      said concavo-convex lens having said optical axis and being between said plano-convex lens and said mirror surface,
   a meniscus lens having said optical axis and being disposed between said concavo-convex lens and said mirror surface,
      said meniscus lens being spaced from said plano-convex lens a large part of the distance from said plano-convex lens to said mirror surface, the convex surface of said meniscus lens facing said mirror surface,
   a light source,
   a first prism to direct light from said source through said lenses from which it passes to said mirror surface,
      said light reflecting from said mirror surface and passing back through said lenses,
      there being an object plane disposed between said light source and said first prism,
   a second prism to direct to an image plane said light that reflects from said mirror surface and passes back through said lenses, and
   a magnification compensator disposed between said prisms and one of said object plane and said image plane.

34. The invention as claimed in claim 33, in which said magnification compensator comprises two parallel lenses and further comprises actuator means to adjust the distance between said magnification compensator lenses, one of said magnification compensator lenses being a plano-convex lens, the other of said magnification compensator lenses being a plano-concave lens.

35. A Dyson lens system, comprising:
   a primary mirror having a concave mirror surface,
   a plano-convex lens spaced a large distance from said mirror surface,
      said plano-convex lens having its convex surface facing said mirror surface and having the same optical axis as said mirror surface,
   a concavo-convex lens having its convex surface facing said mirror surface,
      said concavo-convex lens having said optical axis and being between said plano-convex lens and said mirror surface,
   a meniscus lens having said optical axis and being disposed between said concavo-convex lens and said mirror surface,
      said meniscus lens being spaced from said plano-convex lens a large part of the distance from said plano-convex lens to said mirror surface, the convex surface of said meniscus lens facing said mirror surface,
   a light source,
   a first prism to direct light from said source through said lenses from which it passes to said mirror surface,
      said light reflecting from said mirror surface and passing back through said lenses, and
   a second prism to direct to an image plane said light that reflects from said mirror surface and passes back through said lenses,
      one of said first and second prisms being a roof prism, the other of said first and second prisms being a turning prism.

36. A Dyson lens system, comprising:
   a primary mirror having a concave mirror surface,
      said concave mirror surface being slightly aspherical,
   a plano-convex lens element spaced a large distance from said mirror surface,
      said plano-convex lens element having its convex surface facing said mirror surface and having the same optical a axis as said mirror surface,
   a concavo-convex lens element having its convex surface facing said mirror surface,
      said concavo-convex lens element having said optical axis and being between said plano-convex lens element and said mirror surface,
   a meniscus lens having said optical axis and being disposed between said concavo-convex lens element and said mirror surface,
      said meniscus lens being spaced a large part of the distance from said plano-convex lens element to said mirror surface, the convex surface of said meniscus lens facing said mirror surface,
   a light source,
   a first prism to direct light from said source through said lenses from which it passes to said mirror surface,
      said light reflecting from said mirror surface and passing back through said lenses, and
   a second prism to direct to an image plane said light that reflects from said mirror surface and passes back through said lenses,
      said plano-convex lens element and said concavo-convex lens element being a doublet and being formed of different glass types.

37. The invention as claimed in any of claims 23, 35, 24, 27, 36, 28, 25, 31, 32, 29 & 30, in which the space between said meniscus lens and said mirror surface is an air gap, and in which the space between said concavo-convex and said meniscus lens is an air gap.

38. A Dyson lens system, which comprises:
   a first prism and a second prism mounted adjacent each other,
   a primary mirror spaced from said prisms and having a substantially spherical mirror surface facing said prisms,
      said first prism being oriented to direct light from a light source toward said mirror surface,
      said second prism being oriented to receive light from said mirror surface and to direct said received light toward an image plane,
   lens disposed between said prisms and said mirror surface and having the same optical axis as said mirror surface,
      said lens cooperating with said first and second prisms in transmitting said light to said mirror surface and then from said mirror surface toward said image plane, said first prism being a roof prism and said second prism being a turning prism, said prisms and said mirror surface cooperating with each other in orienting an image at said image plane, to cause such image to be oriented the same as the object at the object plane, and a magnification adjustor disposed adjacent said prisms to change slightly the magnification of the system.

39. The invention as claimed in claim 38, in which said prisms and said primary mirror and said lens are all disposed between an object plane and said image plane, said object and image planes being parallel to each other.

40. The invention as claimed in claim 38, in which there are provided means to adjust precisely the position of at least one of said prisms.

41. A substantially one-to-one imaging method, which comprises:

providing a concave mirror surface and a first lens in Dyson relationship to each other;

providing an additional lens between said first lens and said mirror surface and spaced from said first lens a large part of the distance from said first lens to said mirror surface, directing radiation through said first lens and said additional lens to said mirror surface, so that said radiation reflects back from said mirror surface through said additional lens and said first lens, performing said steps in Dyson manner so that the magnification ratio is substantially one-to-one, and directing said reflected radiation from said first lens to an image plane in such manner that the image is not inverted, and without causing said reflected radiation to pass through any additional lenses that are related to each other in Dyson manner.

42. The invention as claimed in claim 41, in which said method further comprises providing said concave mirror surface as an aspherical concave mirror surface.

43. The invention as claimed in claim 41, in which said method further comprises providing said additional lens as a thick meniscus lens the convex side of which faces said mirror surface.

44. The invention as claimed in claim 41, in which said method further comprises providing said first lens as a plano-convex doublet the convex surface of which faces toward said mirror surface.

45. The invention as claimed in claim 41, in which said method further comprises providing said mirror surface as an aspherical mirror surface, providing said additional lens as a meniscus lens the convex surface of which faces toward said mirror surface, and providing said first lens as a plano-convex doublet the convex surface of which faces toward said mirror surface.

46. The invention as claimed in claim 45, in which said method further comprises spacing said thick meniscus lens about one-quarter of the distance from said first lens to said mirror surface.

47. The invention as claimed in claim 45, in which said method further comprises spacing said thick meniscus lens about one-third of the distance from said first lens to said mirror surface.

48. The invention as claimed in claim 44, in which said method further comprises spacing said additional lens about one-quarter of the distance from said first lens to said mirror surface.

49. The invention as claimed in claim 41, in which said method further comprises spacing said additional lens about one-third of the distance from said first lens to said mirror surface.

50. The invention as claimed in any of claims 41, 42, 43, 44, 45, 48, 49, 46 & 47, in which said method further comprises causing the space between said additional lens and said mirror surface to be an air gap, and causing the space between said first lens and said additional lens to be an air gap.

51. A method of providing unit imaging but with controlled slight variation in magnification in order to compensate for variations in substrate sizes that occur during microelectronics manufacture, said method comprising:

providing a primary mirror having a substantially spherical concave surface, directing light toward said mirror surface through three lenses each having a different glass type adapted to minimize chromatic and other aberrations, employing optical elements including a prism to direct to an image plane light that reflects from said mirror surface and passes back through said three lenses, providing a large air gap between said image plane and said optical elements including a prism, providing an image-size adjustor in said air gap, and operating said image-size adjustor to change slightly the size of the image to different values close to one-to-one.

52. A Dyson lens system, which comprise:

a radiation source to pass radiation through an object plane, a primary mirror having a concave surface, lens disposed to pass radiation to said primary mirror and also to receive reflected radiation from said primary mirror, transmitting means to transmit radiation from said radiation source to said lens means, and to transmit reflected radiation from said lens to an image plane, and adjustment means to effect very small and accurate adjustments in said transmitting means in order to change slightly the location of the image transmitted to said image plane, said transmitting means comprising two individually-mounted turning elements for directing radiation around corner from said source into said lens and for directing said radiation around a corner from said lens means to said image plane, said adjustment means comprising means to adjust slightly and individually the position of at least one of said individually-mounted turning elements, said mirror and lens being so constructed and oriented that the magnification ratio is substantially one-to-one, said turning elements comprising at least no prism.

53. A Dyson lens system, which comprises:

a radiation source to pass radiation through an object plane, a primary mirror having a concave surface, lens disposed to pass radiation to said primary mirror and also to receive reflected radiation from said primary mirror, transmitting means to transmit radiation from said radiation source to said lens, and to transmit reflected radiation from said lens means to an image plane, and adjustment means to effect very small and accurate adjustments in said transmitting means in order to change slightly the location of the image transmitted to said image plane, said transmitting means comprising two individually-mounted turning elements for directing radiation around a corner from said source into said lens means and for directing said radiation around a corner from said lens means to said image plane, said adjustment means comprising means to adjust slightly and individually the position of at least one of said individually-mounted turning elements, said mirror and lens being so constructed and oriented that the magnification ratio is substantially one-to-one, said turning elements comprising a roof prism and a turning prism.

54. For use in the manufacture of microelectronics components, an imaging method comprising:

projecting a microelectronics image from an object plane to an image plane through a Dyson imaging system that incorporates turning elements for turning the light around corners as it passes between said object plane and said image plane, and effecting minute precise adjustments in the position of at least one of said turning elements in order to effect a slight change in the microelectronics image projected onto said image plane, said method further comprising projecting onto said image plane two images one of which is in a first position and the other of which is in a second and different position, causing said first and second positions to partially overlap each other, determining whether a small portion of the microelectronics image is precisely registered in the overlapping positions, and making a change in the position of at least one of said turning elements to thereby achieve said precise registry.

55. A method of providing unit imaging in a Dyson system, but with controlled slight variation in magnification in order to compensate for variations in substrate sizes that occur during microelectronics manufacture, said method comprising:

providing a Dyson system including a primary mirror and a lens in Dyson relationship to each other, directing light through said lens toward said mirror, employing optical elements including a prism to direct to an image plane light that reflects from said mirror and passes back through said lens, providing a large air gap between said image plane and said optical elements including a prism, providing an image-size adjustor in said air gap, and operating said image-size adjustor to change slightly the size of the image to different values close to one-to-one.

56. A compensating Dyson lens system, comprising:

a primary mirror having a concave mirror surface, a lens spaced from said mirror surface, said mirror and lens being constructed and oriented to cooperate with each other in Dyson relationship, said mirror and lens being disposed between spaced-apart object and image planes that are parallel to each other, a first prism and a second prism disposed between said object and image planes, and being located on the side of said lens that is remote from said mirror, a radiation source located on the side of said object plane remote from said prisms, said radiation source being adapted to direct radiation through said object plane to one of said prisms, from which said radiation passes through said lens to said mirror and back through said lens and the other of said prisms to said image plane, a large air gap provided between one of said prisms and the one of said planes that is nearest thereto, and a magnification adjustor disposed in said air gap, said magnification adjustor being adapted to be operated to change slightly the magnification of the system so as to compensate for slight variations in the size of a workpiece disposed in said image plane.

57. A method of achieving substantially perfect positioning of an image in the image plane of a projection scanning microlithography apparatus in which the scans are parallel to each other and partially overlap each other, so that there is no twist causing points at the image plane to be out of superposed conditions during adjacent partially-overlapping scans, which method comprises:

providing a test film in the image plane of a projection scanning microlithography apparatus having an optical projection system that is one-to-one and incorporates beam-turning elements, and in which the object and image have the same orientation, providing at least a point in the object plane of said apparatus, passing the field of said system through said point and through said optical projection system onto said film, relatively moving said optical projection system on the one hand, and said point and said film on the other hand, to a position such that:

(a) the moved field only partially overlaps the above-mentioned field, and (b) the resulting projected point would under conditions of high accuracy be superposed on the point resulting from the field stated above, and physically adjusting the position of at least one of said turning elements until said "two" points are superposed.

58. In combination with a projection-scanning microlithography apparatus of the type in which the scans are parallel to each other and partially overlap each other, and in which the object and image planes are parallel to each other and spaced from each other, an adjustable optical system for projecting a twist-free one-to-one image from a mask in said object plane to a substrate in said image plane with the object and image having the same orientation, said adjustable optical system comprising:

a concave primary mirror, first turning means to receive radiation passed through the object plane and turn said radiation for transmission to said mirror, second turning means to receive said radiation from said primary mirror and turn said radiation for transmission to the image plane, first mounting means to mount said first turning means, second mounting means to mount said second turning means separately and independently from said first mounting means and from said first turning means, first adjustment means to effect slight individual adjustments of the position of said first turning means, to thereby slightly adjust the position of the image at said image plane, and second adjustment means to effect slight individual adjustment of the position of said second turning means, to thereby slightly adjust the position of the image at said image plane.

59. The invention as claimed in claim 58, in which each of said first and second mounting means comprises a fixed base, a plate, means to rigidly connect said plate to one of said turning means, and a flexural beam integral with said base and with said plate to permit slight adjustment in the position of said plate and thus of said one turning means, and in which each of said first and second adjustment means comprises means to slightly move one of said plates relative to the associated base and thus effect slight flexing of the flexural beam therebetween.

* * * * *

UNITED STATES PATENT AND TRADEMARK OFFICE
CERTIFICATE OF CORRECTION

PATENT NO. : 5,559,629
DATED : September 24, 1996
INVENTOR(S) : Ronald E. Sheets and Yanrong Yuan It is certified that error appears in the above-indentified patent and that said Letters Patent is hereby corrected as shown below:

Column 23, line 52, claim 45, between the terms "a" and "meniscus" insert the term --thick--.

Column 24, line 45, claim 52, between the terms "around" and "corner" insert the term --a--.

Column 24, line 54, claim 52, between the terms "least" and "prism" delete the term "no" and insert therefor the term --one--.

Signed and Sealed this

Fourteenth Day of October, 1997

*Attest:*

BRUCE LEHMAN

*Attesting Officer*   *Commissioner of Patents and Trademarks*